United States Patent
Kim et al.

(10) Patent No.: US 8,703,535 B2
(45) Date of Patent: Apr. 22, 2014

(54) INTEGRATED CIRCUIT PACKAGING SYSTEM WITH WARPAGE PREVENTING MECHANISM AND METHOD OF MANUFACTURE THEREOF

(75) Inventors: MinJung Kim, Kwang-ju (KR); DaeSik Choi, Seoul (KR); MinWook Yu, Suwon-si (KR); YiSu Park, Icheon-si (KR)

(73) Assignee: Stats Chippac Ltd., Singapore (SG)

( * ) Notice: Subject to any disclaimer, the term of this patent is extended or adjusted under 35 U.S.C. 154(b) by 4 days.

(21) Appl. No.: 13/490,908

(22) Filed: Jun. 7, 2012

(65) Prior Publication Data
US 2013/0328179 A1 Dec. 12, 2013

(51) Int. Cl.
*H01L 21/00* (2006.01)

(52) U.S. Cl.
USPC .............. 438/106; 257/730; 257/E23.046

(58) Field of Classification Search
USPC ........ 257/669, 674, 730, E23.046; 438/106
See application file for complete search history.

(56) References Cited

U.S. PATENT DOCUMENTS

| | | | | |
|---|---|---|---|---|
| 4,625,227 A | * | 11/1986 | Hara et al. | 257/775 |
| 5,023,699 A | * | 6/1991 | Hara et al. | 257/692 |
| 6,104,093 A | * | 8/2000 | Caletka et al. | 257/778 |
| 6,576,073 B2 | * | 6/2003 | Hilton et al. | 156/64 |
| 6,670,223 B2 | * | 12/2003 | Gaynes et al. | 438/118 |
| 6,888,238 B1 | * | 5/2005 | Li | 257/706 |
| 7,595,255 B2 | | 9/2009 | Kim et al. | |
| 8,014,154 B2 | | 9/2011 | Lee | |
| 2007/0246814 A1 | | 10/2007 | Fan et al. | |
| 2007/0273019 A1 | | 11/2007 | Huang et al. | |
| 2008/0002374 A1 | | 1/2008 | Fukuzono et al. | |
| 2008/0073784 A1 | * | 3/2008 | Lee | 257/738 |
| 2009/0236730 A1 | * | 9/2009 | Topacio et al. | 257/701 |

* cited by examiner

*Primary Examiner* — Allan R Wilson
(74) *Attorney, Agent, or Firm* — Ishimaru & Associates LLP

(57) ABSTRACT

A method of manufacture of an integrated circuit packaging system includes: providing a package substrate having a warpage-compensation zone with a substrate-interior layer exposed from a top substrate-cover, and the warpage-compensation zone having contiguous exposed portion of the substrate-interior layer over corner portions of the package substrate; connecting an integrated circuit die to the package substrate with an internal interconnect; and forming an encapsulation over the integrated circuit die, with the encapsulation directly on the substrate-interior layer in the warpage-compensation zone.

18 Claims, 4 Drawing Sheets

INTEGRATED CIRCUIT PACKAGING SYSTEM WITH WARPAGE PREVENTING MECHANISM AND METHOD OF MANUFACTURE THEREOF

TECHNICAL FIELD

The present invention relates generally to an integrated circuit packaging system, and more particularly to an integrated circuit packaging system warpage preventing mechanism.

BACKGROUND ART

Increased miniaturization of components, greater packaging density of integrated circuits ("ICs"), higher performance, and lower cost are ongoing goals of the computer industry. Semiconductor packaging structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner. The packaging configurations that house and protect IC require them to be made smaller and thinner as well.

Thus, a need still remains for an integrated circuit packaging system with warpage preventing mechanism providing low cost manufacturing, improved yields, reduction of integrated circuit packaging dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package substrate having a warpage-compensation zone with a substrate-interior layer exposed from a top substrate-cover, and the warpage-compensation zone having contiguous exposed portion of the substrate-interior layer over corner portions of the package substrate; connecting an integrated circuit die to the package substrate with an internal interconnect; and forming an encapsulation over the integrated circuit die, with the encapsulation directly on the substrate-interior layer in the warpage-compensation zone.

The present invention provides an integrated circuit packaging system including: a package substrate having a warpage-compensation zone with a substrate-interior layer exposed from a top substrate-cover, and the warpage-compensation zone having contiguous exposed portion of the substrate-interior layer over corner portions of the package substrate; an integrated circuit die connected to the package substrate with an internal interconnect; and an encapsulation formed over the integrated circuit die, with the encapsulation directly on the substrate-interior layer in the warpage-compensation zone.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
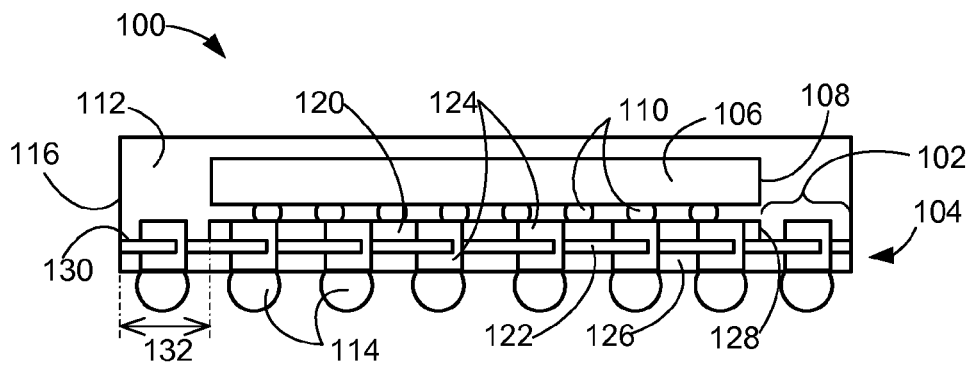
FIG. 1 is a cross-sectional view of an integrated circuit packaging system along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS. The depictions in the FIGS. are arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact between elements. The term "directly on" is defined as having direct contact without any intervening material between elements. The term "processing" as used herein includes deposition of material, patterning, exposure, development, etching, cleaning, molding, and/or removal of the material or as required in forming a described structure.

Figure 2:
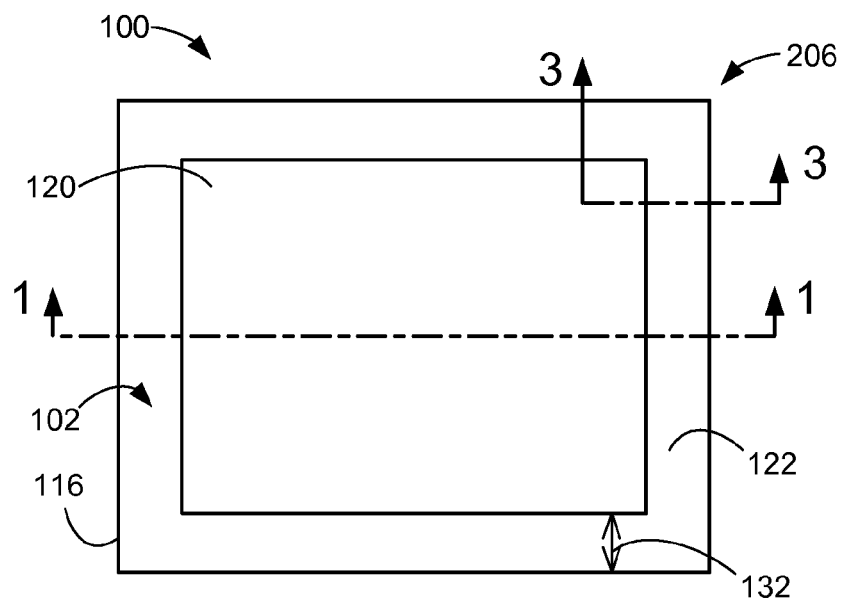
FIG. 2 is a top plan view of the integrated circuit packaging system.

Referring now to FIG. 1, therein is shown a cross-sectional view of an integrated circuit packaging system 100 along a line 1-1 of FIG. 2 in a first embodiment of the present invention. The integrated circuit packaging system 100 includes a warpage-compensation zone 102. The warpage-compensation zone 102 is defined as a portion of a package substrate 104 having structural arrangements to prevent warpage in the integrated circuit packaging system 100. The warpage can be caused during a manufacturing process. Details regarding the package substrate 104 and the warpage-compensation zone 102 will be discussed below.

The integrated circuit packaging system 100 can have an integrated circuit die 106 mounted on the package substrate 104. For example, the integrated circuit die 106 can be a flip chip or a wire bond die mounted on to the package substrate 104.

The integrated circuit die 106 can have a die-perimeter wall 108. The die-perimeter wall 108 can be a surface on the outer non-horizontal side of the integrated circuit die 106. The die-perimeter wall 108 can be vertical or angled.

The integrated circuit packaging system 100 can have an internal interconnect 110. The internal interconnect 110 can be a conductive structure, such as a ball bond, solder ball, solder bump, conductive bumps, or bond wire, for relaying electrical signals to and from the integrated circuit die 106. The internal interconnect 110 can be connected to a portion of the package substrate 104 used for relaying the electrical signals. The internal interconnect 110 can be also used to mount the integrated circuit die 106 to the package substrate 104.

The integrated circuit packaging system 100 can have an encapsulation 112. The encapsulation 112 can be over the integrated circuit die 106, the package substrate 104, the internal interconnect 110, or a combination thereof. The encapsulation 112 can fill any space between the integrated circuit die 106, the package substrate 104, the internal interconnect 110, or a combination thereof.

The integrated circuit packaging system 100 can have an external interconnect 114. The external interconnect 114 can be a conductive structure for electrically coupling the integrated circuit packaging system 100 to other structures, such as components or other packages. For example, the external interconnect 114 can be a solder ball, conductive posts, lands, or a combination thereof.

The integrated circuit packaging system 100 can have an outer perimeter surface 116. For example, the outer perimeter surface 116 can be the non-horizontal surface along the perimeter of the package substrate 104, such as resulting from a punch-type of singulation process. Also, for example, the outer perimeter surface 116 can be a combination of a peripheral surface of the encapsulation 112, a peripheral surface of the package substrate 104, the conductive structure of the package substrate 104, or a combination thereof, such as resulting from a saw-type of singulation process.

The package substrate 104, such as a printed circuit board or pre-impregnated (PPG) substrate, can have a top substrate-cover 120, a substrate-interior layer 122, a conductive portion 124, and a bottom substrate-cover 126. The top substrate-cover 120 and the bottom substrate-cover 126 can be nonconductive material, including dielectric or solder resist material, forming the top and bottom portions and surfaces of the package substrate 104. The top substrate-cover 120, the bottom substrate-cover 126, or a combination thereof can be on the substrate-interior layer 122, on or around the conductive portion 124, or a combination thereof.

The top substrate-cover 120 can have a top substrate-side 128 along a perimeter of the top substrate-cover 120. The top substrate-side 128 can be a vertical or angled surface of the top substrate-cover 120 extending from a top surface of the top substrate-cover 120 to a top surface of the substrate-interior layer 122. The top substrate-side 128 can be coplanar with the die-perimeter wall 108. The top surface of the top substrate-cover 120 can also be directly under an inner portion of the integrated circuit die 106 or horizontally between the die-perimeter wall 108 and the outer perimeter surface 116.

The substrate-interior layer 122 can be a structure made of epoxy resin material and can have fiber material therein, such as in PPG layers. The substrate-interior layer 122 can be nonconductive. The substrate-interior layer 122 can have the conductive portion 124 attached or formed thereon. The substrate-interior layer 122 can have a top support surface 130.

The conductive portion 124, such as pads, leads, vias, traces, or a combination thereof, can be on the substrate-interior layer 122. The conductive portion 124 can be used to relay electrical signals around the surfaces of the package substrate 104 to and from different structures attached to the package substrate 104. The internal interconnect 110 can be on the conductive portion 124.

The conductive portion 124 can be on a top or bottom surface of the substrate-interior layer 122, can go through the substrate-interior layer 122, or a combination thereof. A top surface of the conductive portion 124 can be coplanar with the top surface of the top substrate-cover 120. The top surface of the conductive portion 124 can also be above or below the top surface of the conductive portion 124.

The package substrate 104 can have the warpage-compensation zone 102 formed with the top substrate-side 128 of the top substrate-cover 120, the top support surface 130 of the substrate-interior layer 122, the conductive portion 124, or a combination thereof. The warpage-compensation zone 102 can have the top substrate-side 128 toward the inner portion of the integrated circuit packaging system 100. The warpage-compensation zone 102 can have the top substrate-side 128 directly on the top support surface 130. The warpage-compensation zone 102 can extend outward to the outer perimeter surface 116.

The warpage-compensation zone 102 can have the substrate-interior layer 122 exposed from the top substrate-cover 120. The encapsulation 112 can be directly on the substrate-interior layer 122 in the warpage-compensation zone 102. The encapsulation 112 can fill the warpage-compensation zone 102. The encapsulation 112 can be directly on the top substrate-side 128, the top support surface 130, or a combination thereof in the warpage-compensation zone 102.

It has been discovered that the warpage-compensation zone 102 having the encapsulation 112 directly on the substrate-interior layer 122 prevents warpage in the integrated circuit packaging system 100. The difference in volume between a center portion and outer portions of the integrated circuit packaging system 100 due to the integrated circuit die 106 and the internal interconnect 110 can cause warpage in packages during the manufacturing process. The direct contact between the encapsulation 112 and the substrate-interior layer 122 in the warpage-compensation zone 102 can be used to control the volume and density along the outer portions of the integrated circuit packaging system 100.

It has also been discovered that the warpage-compensation zone 102 having the encapsulation 112 directly on the substrate-interior layer 122 prevents warpage in the integrated circuit packaging system 100. The warpage-compensation zone 102 having the encapsulation 112 directly on the substrate-interior layer 122 can utilize the difference between the coefficient of thermal expansion (CTE) or the shrinkage amount between the top substrate-cover 120, the bottom substrate-cover 126, and the encapsulation 112.

It has further been discovered that the warpage-compensation zone 102 having the encapsulation 112 directly on the substrate-interior layer 122, without any additional support or stress-relief structures, reduces the cost and manufacturing complexity required for preventing warpage. The warpage-compensation zone 102 having the encapsulation 112 directly on the substrate-interior layer 122 can reduces the cost and manufacturing complexity by eliminating the need for additional support or stress-relief structures.

The warpage-compensation zone 102 can have a zone size 132. The zone size 132 is defined as a distance between the top substrate-side 128 and the outer perimeter surface 116. The zone size 132 can be used to control the volume or density around the around periphery areas of the integrated circuit packaging system 100.

It has been discovered that the warpage-compensation zone 102 having the zone size 132 provides efficiency and cost reduction in preventing warpage in the integrated circuit packaging system 100. The warpage-compensation zone 102 having the zone size 132 provides efficiency and cost reduction by providing a simple way to control the volume and contact surfaces in managing the effects during the solder reflow process from the difference in CTE of the various materials.

For example, the top substrate-cover 120 can be solder resist. The zone size 132 can be set based on the shrinkage rate of the solder resist material being three times higher than the shrinkage rate of the encapsulation 112 to prevent warping along the periphery of the integrated circuit packaging system 100.

Referring now to FIG. 2, therein is shown a top plan view of the integrated circuit packaging system 100. The top plan view can show the integrated circuit packaging system 100 without the encapsulation 112 of FIG. 1, the conductive portion 124 of FIG. 1, and the integrated circuit die 106 of FIG. 1.

The integrated circuit packaging system 100 can have the integrated circuit die 106 over a central portion of the package substrate 104 of FIG. 1 and the warpage-compensation zone 102 surrounding the integrated circuit die 106 and extending out to the outer perimeter surface 116. The integrated circuit packaging system 100 can have the conductive portion 124 exposed on the top surface of the package substrate 104, including the warpage-compensation zone 102. The integrated circuit packaging system 100 can have the encapsulation 112 over the package substrate and the integrated circuit die 106.

For illustrative purposes, the warpage-compensation zone 102 is shown as having a portion under the integrated circuit die 106 or having the top substrate-side 128 of FIG. 1 coplanar with the die-perimeter wall 108 of FIG. 1. However, it is understood that the warpage-compensation zone 102 can be different and have the top substrate-side 128 between the die-perimeter wall 108 and the outer perimeter surface 116. For example, the top substrate-cover 120 can extend beyond the periphery side of the integrated circuit die 106.

The warpage-compensation zone 102 can be a rectangular frame shape, having orthogonal junction in the corners, surrounding the integrated circuit die 106, the top substrate-cover 120, or a combination thereof. For example, the warpage-compensation zone 102 can be the shape of the non-overlapping area formed by two concentric rectangles, outer rectangle having larger dimensions than the inner rectangle, with the non-overlapping area surrounding the inner rectangle. The warpage-compensation zone 102 can have a constant value of the zone size 132 around the perimeter of the top substrate-cover 120.

It has been discovered that the warpage-compensation zone 102 having the rectangular frame shape provide efficiency and lower cost in providing warpage control. The warpage-compensation zone 102 having the rectangular frame shape without any additional patterning in the corner can greatly reduce the patterning and shaping process for forming the warpage-compensation zone 102. It has further been discovered that the warpage-compensation zone 102 having the rectangular frame shape, including orthogonal corner shapes, provide increased die mount area.

It has also been discovered that the warpage-compensation zone 102 having a constant value of the zone size 132 around the periphery of the package substrate 104 provide efficiency and lower cost in providing warpage control. The warpage-compensation zone 102 having the constant value of the zone size 132 can eliminate separately patterning the warpage-compensation zone 102. Further, having the constant value of the zone size 132 can simplify the manufacturing process by referencing the integrated circuit die 106 or the outer perimeter surface 116.

The integrated circuit packaging system 100 can have the substrate-interior layer 122 exposed in the warpage-compensation zone 102 from the top view without the encapsulation 112. The warpage-compensation zone 102 can have the top support surface 130 of FIG. 1 contiguously exposed from the top substrate-cover 120.

The contiguously exposed portion of the top substrate-cover 120 can include a corner portion 206 of the package substrate 104, having a pair of non-horizontal sides of the package substrate 104 meeting at an angle. The contiguously exposed portion of the top substrate-cover 120 can include up to all four instances of the corner portion 206 of the package substrate 104. The encapsulation 112 can directly on the top support surface 130 of the substrate-interior layer 122 in the warpage-compensation zone 102.

It has been discovered that the warpage-compensation zone 102 preventing warpage of the package only through direct contact between the encapsulation 112 and the package substrate 114 of FIG. 1 without additional support or stress relief structures provide increased space for the conductive portion 124. Since the warpage-compensation zone 102 does not have any support or stress relief structures occupying space or any further conductive structures, the conductive portion 124 can be in the warpage-compensation zone 102.

It has further been discovered that the warpage-compensation zone 102 having the contiguously exposed portion of the top substrate-cover 120 including one or more instances of the corner portion 206 of the package substrate 104 provide reduced manufacturing complexity and cost in preventing warpage in the package. The contiguously exposed portion of the top substrate-cover 120 including one or more instances of the corner portion 206 can eliminate special patterning and simply expose the substrate-interior layer 122 on the periphery of the package substrate 104, including the corner portion 206.

Figure 3:
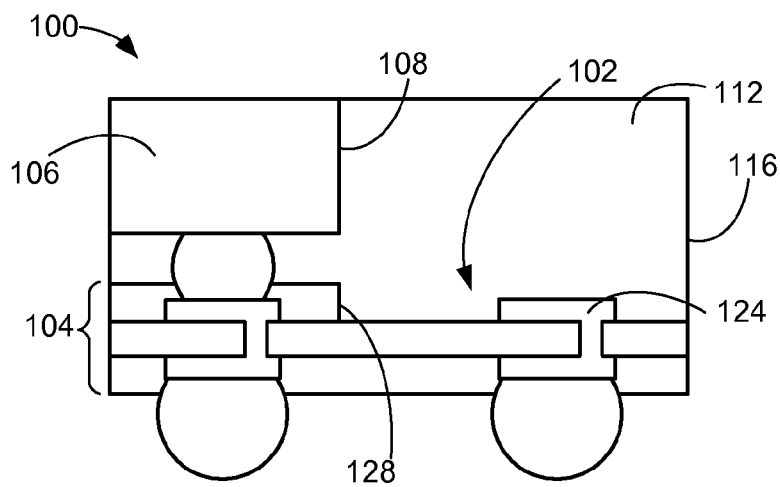
FIG. 3 is a detailed cross-sectional view of the integrated circuit packaging system along a line 3-3 of FIG. 2.

Referring now to FIG. 3, therein is shown a detailed cross-sectional view of the integrated circuit packaging system 100 along a line 3-3 of FIG. 2. The integrated circuit packaging system 100 can have the top substrate-side 128 located in various places relative to the die-perimeter wall 108.

For example, the warpage-compensation zone 102 can have the top substrate-side 128 coplanar with a periphery surface of the integrated circuit die 106 and extend horizontally outward to the outer perimeter surface 116. The warpage-compensation zone 102 can also be directly under and overlap with the integrated circuit die 106 or have the top substrate-side 128 between the periphery surface of the integrated circuit die 106 and the outer perimeter surface 116.

It has been discovered that having the warpage-compensation zone 102 having the top substrate-side 128 coplanar with the periphery surface of the integrated circuit die 106 or the warpage-compensation zone 102 overlapping the integrated circuit die 106 provides an enhanced degree of control for managing warpage control. The warpage-compensation zone 102 extending from the outer perimeter surface 116 up to or beyond the periphery surface of the integrated circuit die 106 gives increased range in controlling the volume or density around along the outer portions of the integrated circuit packaging system 100 to control warpage thereof.

The integrated circuit packaging system 100 can have the conductive portion 124 in the warpage-compensation zone 102. The integrated circuit packaging system 100 can have the conductive portion 124 in the warpage-compensation zone 102 only for electrically coupling different structures and not for structural support.

The integrated circuit packaging system 100 can control the contact between the package substrate 104 and the encapsulation 112 through the warpage-compensation zone 102. The amount of contact between portions of the package substrate 104 and the encapsulation 112 in the warpage-compensation zone 102 can manage the differences in the CTE values of the materials in the periphery portion of the integrated circuit packaging system 100. The integrated circuit packaging system 100 can thusly prevent warpage through the warpage-compensation zone 102 without any additional support or stress relief structures.

Figure 4:
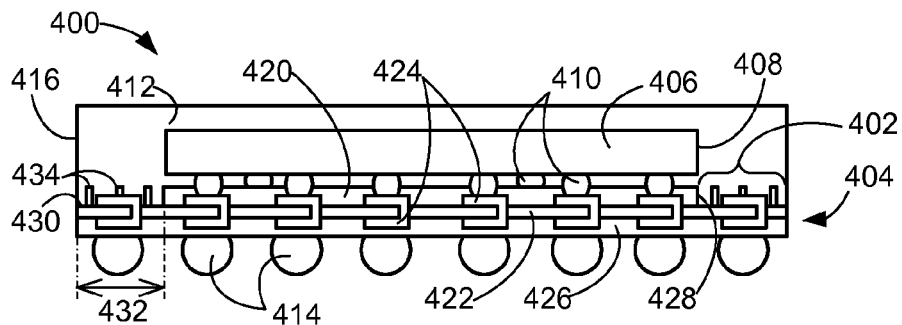
FIG. 4 is a cross-sectional view of an integrated circuit packaging system along a line 4-4 of FIG. 5 in a second embodiment of the present invention.
Figure 5:
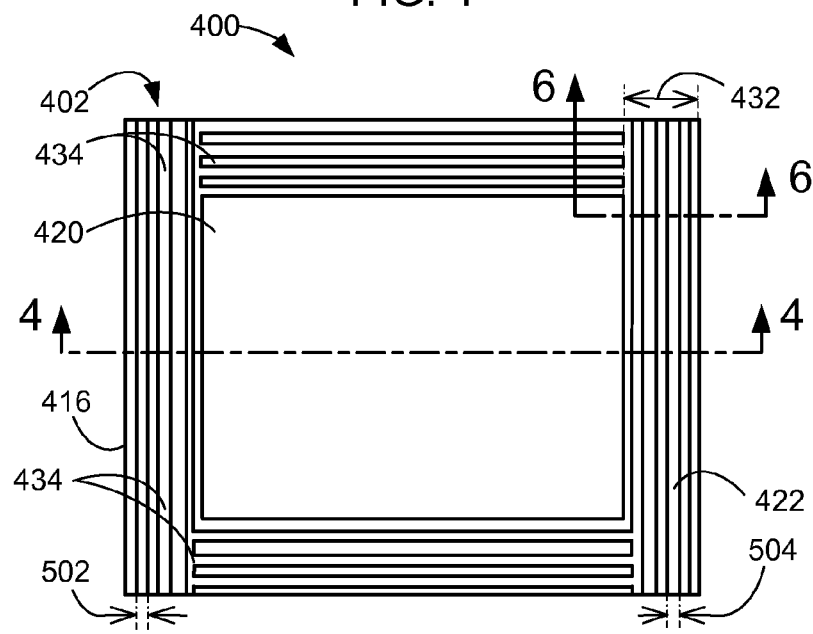
FIG. 5 is a top plan view of the integrated circuit packaging system.

Referring now to FIG. 4, therein is shown a cross-sectional view of an integrated circuit packaging system 400 along a line 4-4 of FIG. 5 in a second embodiment of the present invention. The integrated circuit packaging system 400 includes a warpage-compensation zone 402.

The warpage-compensation zone 402 is defined as a portion of a package substrate 404 having structural arrangements to prevent warpage in the integrated circuit packaging system 400. The warpage can be caused during a manufacturing process. Details regarding the package substrate 404 and the warpage-compensation zone 402 will be discussed below.

The integrated circuit packaging system 400 can have an integrated circuit die 406 mounted on the package substrate 404. For example, the integrated circuit die 406 can be a flip chip or a wire bond die mounted on to the package substrate 404.

The integrated circuit die 406 can have a die-perimeter wall 408. The die-perimeter wall 408 can be a surface on the outer non-horizontal side of the integrated circuit die 406. The die-perimeter wall 408 can be vertical or angled.

The integrated circuit packaging system 400 can have an internal interconnect 410. The internal interconnect 410 can be a conductive structure, such as a ball bond, solder ball, solder bump, conductive bumps, or bond wire, for relaying electrical signals to and from the integrated circuit die 406. The internal interconnect 410 can be connected to a portion of the package substrate 404 used for relaying the electrical signals. The internal interconnect 410 can be also used to mount the integrated circuit die 406 to the package substrate 404.

The integrated circuit packaging system 400 can have an encapsulation 412. The encapsulation 412 can be over the integrated circuit die 406, the package substrate 404, the internal interconnect 410, or a combination thereof. The encapsulation 412 can fill any space between the integrated circuit die 406, the package substrate 404, the internal interconnect 410, or a combination thereof.

The integrated circuit packaging system 400 can have an external interconnect 414. The external interconnect 414 can be a conductive structure for electrically coupling the integrated circuit packaging system 400 to other structures, such as components or other packages. For example, the external interconnect 414 can be a solder ball, conductive posts, lands, or a combination thereof.

The integrated circuit packaging system 400 can have an outer perimeter surface 416. For example, the outer perimeter surface 416 can be the non-horizontal surface along the perimeter of the package substrate 404, such as resulting from a punch-type of singulation process. Also, for example, the outer perimeter surface 416 can be a combination of a peripheral surface of the encapsulation 412, a peripheral surface of the package substrate 404, the conductive structure of the package substrate 404, or a combination thereof, such as resulting from a saw-type of singulation process.

The package substrate 404, such as a printed circuit board or pre-impregnated (PPG) substrate, can have a top substrate-cover 420, a substrate-interior layer 422, a conductive portion 424, and a bottom substrate-cover 426. The top substrate-cover 420 and the bottom substrate-cover 426 can be nonconductive material, including dielectric or solder resist material, forming the top and bottom portions and surfaces of the package substrate 404. The top substrate-cover 420, the bottom substrate-cover 426, or a combination thereof can be on the substrate-interior layer 422, on or around the conductive portion 424, or a combination thereof.

The top substrate-cover 420 can have a top substrate-side 428 along a perimeter of the top substrate-cover 420. The top substrate-side 428 can be a vertical or angled surface of the top substrate-cover 420 extending from a top surface of the top substrate-cover 420 to a top surface of the substrate-interior layer 422. The top substrate-side 428 can be coplanar with the die-perimeter wall 408. The top surface of the top substrate-cover 420 can also be directly under an inner portion of the integrated circuit die 406 or horizontally between the die-perimeter wall 408 and the outer perimeter surface 416.

The substrate-interior layer 422 can be a structure made of epoxy resin material and can have fiber material therein, such as in PPG layers. The substrate-interior layer 422 can be nonconductive. The substrate-interior layer 422 can have the conductive portion 424 attached or formed thereon. The substrate-interior layer 422 can have a top support surface 430.

The conductive portion 424, such as pads, leads, vias, traces, or a combination thereof, can be on the substrate-interior layer 422. The conductive portion 424 can be used to relay electrical signals around the surfaces of the package substrate 404 to and from different structures attached to the package substrate 404. The internal interconnect 410 can be on the conductive portion 424.

The conductive portion 424 can be on a top or bottom surface of the substrate-interior layer 422, can go through the substrate-interior layer 422, or a combination thereof. A top surface of the conductive portion 424 can be coplanar with the top surface of the top substrate-cover 420. The top surface of the conductive portion 424 can also be above or below the top surface of the conductive portion 424.

The package substrate 404 can have the warpage-compensation zone 402 formed with the top substrate-side 428 of the top substrate-cover 420, the top support surface 430 of the substrate-interior layer 422, the conductive portion 424, or a combination thereof. The warpage-compensation zone 402 can have the top substrate-side 428 toward the inner portion of the integrated circuit packaging system 400. The warpage-compensation zone 402 can have the top substrate-side 428 directly on the top support surface 430. The warpage-compensation zone 402 can extend outward to the outer perimeter surface 416.

The warpage-compensation zone 402 can have the substrate-interior layer 422 exposed from the top substrate-cover 420. The encapsulation 412 can be directly on the substrate-interior layer 422 in the warpage-compensation zone 402. The encapsulation 412 can fill the warpage-compensation zone 402. The encapsulation 412 can be directly on the top substrate-side 428, the top support surface 430, or a combination thereof in the warpage-compensation zone 402.

It has been discovered that the warpage-compensation zone 402 having the encapsulation 412 directly on the substrate-interior layer 422 prevents warpage in the integrated circuit packaging system 400. The difference in volume between a center portion and outer portions of the integrated circuit packaging system 400 due to the integrated circuit die 406 and the internal interconnect 410 can cause warpage in packages during the manufacturing process. The direct contact between the encapsulation 412 and the substrate-interior layer 422 in the warpage-compensation zone 402 can be used to control the volume and density along the outer portions of the integrated circuit packaging system 400.

It has also been discovered that the warpage-compensation zone 402 having the encapsulation 412 directly on the substrate-interior layer 422 prevents warpage in the integrated circuit packaging system 400. The warpage-compensation zone 402 having the encapsulation 412 directly on the substrate-interior layer 422 can utilize the difference between the coefficient of thermal expansion (CTE) or the shrinkage amount between the top substrate-cover 420, the bottom substrate-cover 426, and the encapsulation 412.

It has further been discovered that the warpage-compensation zone 402 having the encapsulation 412 directly on the substrate-interior layer 422, without any additional support or stress-relief structures, reduces the cost and manufacturing complexity required for preventing warpage. The warpage-compensation zone 402 having the encapsulation 412 directly on the substrate-interior layer 422 can reduces the cost and manufacturing complexity by eliminating the need for additional support or stress-relief structures.

The warpage-compensation zone 402 can have a zone size 432. The zone size 432 is defined as a distance between the top substrate-side 428 and the outer perimeter surface 416. The zone size 432 can be used to control the volume or density around the around periphery areas of the integrated circuit packaging system 400.

It has been discovered that the warpage-compensation zone 402 having the zone size 432 provides efficiency and cost reduction in preventing warpage in the integrated circuit packaging system 400. The warpage-compensation zone 402 having the zone size 432 provides efficiency and cost reduction by providing a simple way to control the volume and contact surfaces in managing the effects during the solder reflow process from the difference in CTE of the various materials.

The warpage-compensation zone 402 can have a top cover strip 434. The top cover strip 434 can be directly on the top support surface 430, and can be between the top substrate-side 428 and the outer perimeter surface 416. The top cover strip 434 can be parallel to the top substrate-side 428, the outer perimeter surface 416, or a combination thereof on either side of the top cover strip 434. A top surface of the top cover strip 434 can be coplanar with, above, or below a top surface of the top substrate-cover 420.

The top cover strip 434 can be nonconductive. The top cover strip 434 can be the same material as the top substrate-cover 420, the bottom substrate-cover 426, or a combination thereof. The top cover strip 434 can be formed simultaneously as the top substrate-cover 420. The top cover strip 434 can be over, directly on, or both in relation to the top support surface 430, the conductive portion 424, or a combination thereof.

It has been discovered that the warpage-compensation zone 402 preventing warpage of the package only through direct contact between the encapsulation 412 and the package substrate 404 without additional support or stress relief structures provide increased space for the conductive portion 424. Since the warpage-compensation zone 402 does not have any support or stress relief structures occupying space or any further conductive structures, the conductive portion 424 can be in the warpage-compensation zone 402.

The top cover strip 434 can be used to control the amount of direct contact between the encapsulation 412 and the top support surface 430. Further, the CTE differences between the encapsulation 412 and the package substrate 404 can be managed through the warpage-compensation zone 402 having the top cover strip 434 to control the warpage in the integrated circuit packaging system 400. The top cover strip 434 can be used to only control the amount of direct contact and the density, volume, or a combination thereof around the periphery of the integrated circuit packaging system 400, without providing any direct structural support or stress-relief.

It has been discovered that the warpage-compensation zone 402 having the top cover strip 434 provide reduced cost and simplified manufacturing process in controlling the warpage of circuit packages. The warpage-compensation zone 402 having the top cover strip 434 can use the top cover strip 434, formed simultaneously with the top substrate-cover 420, to control the amount of mass, density, and contact between structures along the periphery of the integrated circuit packaging system 400.

For example, the top cover strip 434 and the top substrate-cover 420 can be solder resist. The zone size 432, size or orientation of the top cover strip 434, or combination thereof can be configured based on the shrinkage rate of the solder resist material being three time higher than the shrinkage rate of the encapsulation 412 to prevent warping along the periphery of the integrated circuit packaging system 400.

For illustrative purposes, the integrated circuit packaging system 400 is shown having three instances of the top cover strip 434 on each side of the integrated circuit packaging system 400. However, it is understood that the integrated circuit packaging system 400 can have any number of instances for the integrated circuit packaging system 400. It is also understood that the integrated circuit packaging system 400 can have different number of instances for the top cover strip 434 between different peripheral sides of the integrated circuit packaging system 400.

Referring now to FIG. 5, therein is shown a top plan view of the integrated circuit packaging system 400. The top plan view can show the integrated circuit packaging system 400 without the encapsulation 412 of FIG. 4, the conductive portion 424 of FIG. 4, and the integrated circuit die 406 of FIG. 4.

The integrated circuit packaging system 400 can have the integrated circuit die 406 over a central portion of the package substrate 404 of FIG. 4 and the warpage-compensation zone 402 surrounding the integrated circuit die 406 and extending out to the outer perimeter surface 416. The integrated circuit packaging system 400 can have the conductive portion 424 exposed on the top surface of the package substrate 404, including the warpage-compensation zone 402. The integrated circuit packaging system 400 can have the encapsulation 412 over the package substrate and the integrated circuit die 406.

For illustrative purposes, the warpage-compensation zone 402 is shown as having a portion under the integrated circuit die 406 or having the top substrate-side 428 of FIG. 4 coplanar with the die-perimeter wall 408 of FIG. 4. However, it is understood that the warpage-compensation zone 402 can be different and have the top substrate-side 428 between the die-perimeter wall 408 and the outer perimeter surface 416. For example, the top substrate-cover 420 can extend beyond the periphery side of the integrated circuit die 406.

The warpage-compensation zone 402 can be a rectangular frame shape, having orthogonal junction in the corners, surrounding the integrated circuit die 406, the top substrate-cover 420, or a combination thereof. The warpage-compensation zone 402 can have a constant value of the zone size 432 around the perimeter of the top substrate-cover 420.

It has been discovered that the warpage-compensation zone 402 having the rectangular frame shape provide efficiency and lower cost in providing warpage control. The warpage-compensation zone 402 having the rectangular frame shape without any additional patterning in the corner can greatly reduce the patterning and shaping process for forming the warpage-compensation zone 402. It has further been discovered that the warpage-compensation zone 402 having the rectangular frame shape, including orthogonal corner shapes, provide increased die mount area.

It has also been discovered that the warpage-compensation zone 402 having a constant value of the zone size 432 around the periphery of the package substrate 404 provide efficiency and lower cost in providing warpage control. The warpage-compensation zone 402 having the constant value of the zone size 432 can eliminate separately patterning the warpage-compensation zone 402. Further, having the constant value of the zone size 432 can simplify the manufacturing process by referencing the integrated circuit die 406 or the outer perimeter surface 416.

The integrated circuit packaging system 400 can have the substrate-interior layer 422 exposed in the warpage-compensation zone 402 from the top view without the encapsulation 412. The encapsulation 412 can be directly on the top support surface 430 of FIG. 4 of the substrate-interior layer 422 in the warpage-compensation zone 402.

The warpage-compensation zone 402 can have the top cover strip 434 directly on the top support surface 430 of the substrate-interior layer 422. The top cover strip 434 can be parallel to the outer perimeter surface 416, the die-perimeter wall 408, or a combination thereof on either side of the top cover strip 434.

The top cover strip 434 can have a cross-section in a shape of a rectangle and have a length measured along a direction parallel to the outer perimeter surface 416, the die-perimeter wall 408, or a combination thereof on either side of the top cover strip 434. The length of the top cover strip 434 can be equal to a length of the outer perimeter surface 416 or the die-perimeter wall 408.

For example, the top cover strip 434 can extend in a straight line between opposing sides or edges of the package substrate 404. Also, for example, the top cover strip 434 can extend between other orthogonal instances of the top cover strip 434 and have the same length as the die-perimeter wall 408 extending between the other orthogonal instances of the top cover strip 434.

It has been discovered that the top cover strip 434 extending in a straight line between opposing sides or edges of the package substrate 404 provide consistent warpage prevention across the periphery of the integrated circuit packaging system 400 at a lower cost. The straight line extension eliminates further shaping while maintaining continuous exposure and control of the exposure between the encapsulation 412 and the substrate-interior layer 422.

The top cover strip 434 can have a strip-width 502. The strip-width 502 can be measured along a line perpendicular to the die-perimeter wall 408, the outer perimeter surface 416, or a combination thereof on either side of the top cover strip 434. The strip-width 502 of different instances of the top cover strip 434 can be the same within the integrated circuit packaging system 400, or within a portion thereof.

The instances of the top cover strip 434 can be separated by a separation-width 504, measured along the same direction as the strip-width 502. The separation-width 504 between different pairs of the top cover strip 434 can be can be the same within the integrated circuit packaging system 400, or within a portion thereof. Also, orthogonal instances of the top cover strip 434 can be integrally connected.

It has been discovered that the top cover strip 434 having the strip-width 502 and separated by the separation-width 504 provide reduced cost and simplified manufacturing process in controlling the warpage of circuit packages. The strip-width 502, the separation-width 504, and the zone size 432 can be used to control the amount of mass, density, and contact between structures along the periphery of the integrated circuit packaging system 400.

Figure 6:
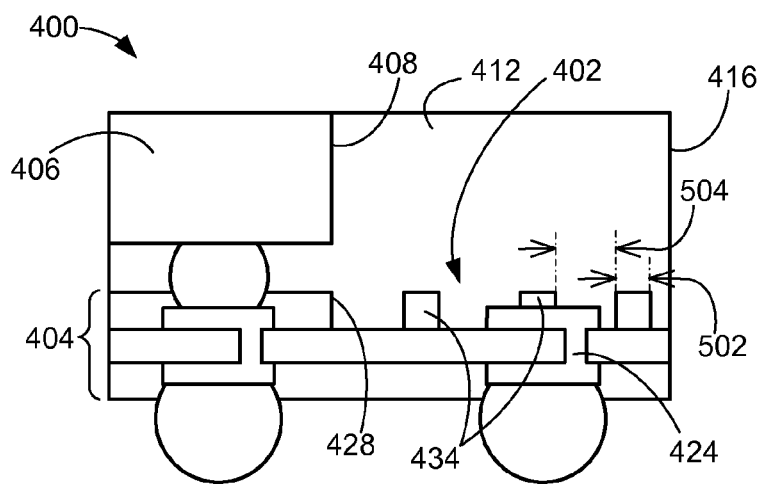
FIG. 6 is a detailed cross-sectional view of the integrated circuit packaging system along a line 6-6 of FIG. 5.

Referring now to FIG. 6, therein is shown a detailed cross-sectional view of the integrated circuit packaging system 400 along a line 6-6 of FIG. 5. The integrated circuit packaging system 400 can have the top substrate-side 428 located in various places relative to the die-perimeter wall 408.

For example, the warpage-compensation zone 402 can have the top substrate-side 428 coplanar with a periphery surface of the integrated circuit die 406 and extend horizontally outward to the outer perimeter surface 416. The warpage-compensation zone 402 can also be directly under and overlap with the integrated circuit die 406 or have the top substrate-side 428 between the periphery surface of the integrated circuit die 406 and the outer perimeter surface 416.

It has been discovered that having the warpage-compensation zone 402 having the top substrate-side 428 coplanar with the periphery surface of the integrated circuit die 406 or the warpage-compensation zone 402 overlapping the integrated circuit die 406 provides an enhanced degree of control for managing warpage control. The warpage-compensation zone 402 extending from the outer perimeter surface 416 up to or beyond the periphery surface of the integrated circuit die 406 gives increased range in controlling the volume or density around along the outer portions of the integrated circuit packaging system 400 to control warpage thereof.

The integrated circuit packaging system 400 can have the conductive portion 424 in the warpage-compensation zone 402. The integrated circuit packaging system 400 can have the conductive portion 424 in the warpage-compensation zone 402 only for electrically coupling different structures and not for structural support.

The integrated circuit packaging system 400 can control the contact between the package substrate 404 and the encapsulation 412 through the warpage-compensation zone 402. The amount of contact between portions of the package substrate 404 and the encapsulation 412 in the warpage-compensation zone 402 can manage the differences in the CTE values of the materials in the periphery portion of the integrated circuit packaging system 400. The integrated circuit packaging system 400 can thusly prevent warpage through the warpage-compensation zone 402 without any additional support or stress relief structures.

The warpage-compensation zone 402 can have the top cover strip 434 directly on the conductive portion 424, the top support surface 430 of FIG. 4, or a combination thereof. The strip-width 502 and the separation-width 504 can be measured horizontally between edges on top surfaces of the top cover strip 434.

Figure 7:
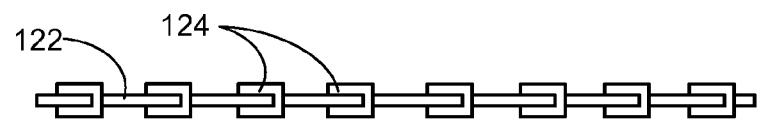
FIG. 7 is an arrangement of the substrate-interior layer and the conductive portion for manufacturing the integrated circuit packaging system of FIG. 1.

Referring now to FIG. 7, therein is shown an arrangement of the substrate-interior layer 122 and the conductive portion 124 for manufacturing the integrated circuit packaging system 100 of FIG. 1. The substrate-interior layer 122 can be a PPG layer or other non-conductive support layer used in forming the package substrate 104 of FIG. 1. The conductive portion 124, such as a trace, a pad, a via, or a combination thereof, can be patterned on the substrate-interior layer 122.

Figure 8:
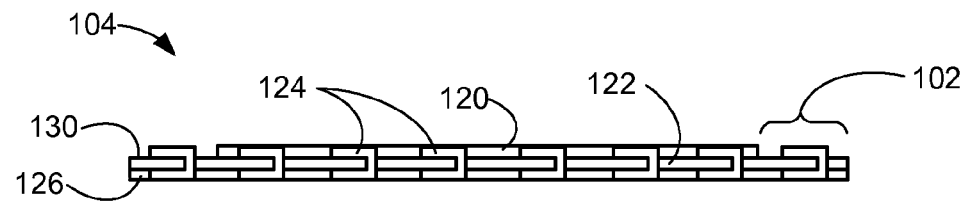
FIG. 8 is the structure of FIG. 7 with the top substrate-cover and the bottom substrate-cover attached thereon.

Referring now to FIG. 8, therein is shown the structure of FIG. 7 with the top substrate-cover 120 and the bottom substrate-cover 126 attached thereon. The top substrate-cover 120, the bottom substrate-cover 126, or a combination thereof can be formed directly on the substrate-interior layer 122 to form the package substrate 104. The top substrate-cover 120, the bottom substrate-cover 126, or a combination thereof can be formed using materials such as dielectric materials or solder resist.

The top substrate-cover 120, the bottom substrate-cover 126, or a combination thereof can be formed on the conductive portion 124, around the conductive portion 124, or a combination thereof. The top surface of the top substrate-cover 120 can be formed to be coplanar with, above, or below the top surface of the conductive portion 124.

The top substrate-cover 120 can be formed over a central portion of the substrate-interior layer 122. The package substrate 104 can have the top support surface 130 exposed from the top substrate-cover 120 to form the warpage-compensation zone 102. The warpage-compensation zone 102 can be on the periphery portions of the package substrate 104 and can surround the top substrate-cover 120.

The top cover strip 434 of FIG. 4 can be formed along with the top substrate-cover 120 to form the package substrate 404 of FIG. 4. The package substrate 404 can be used to form the integrated circuit packaging system 400 of FIG. 4.

Figure 9:
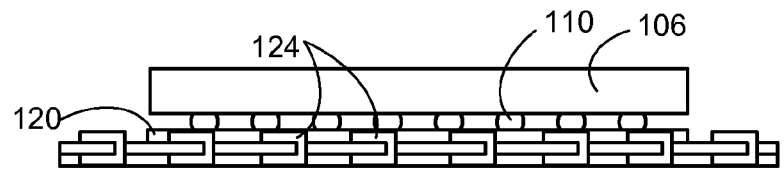
FIG. 9 is the structure of FIG. 8 with the integrated circuit die attached thereon.

Referring now to FIG. 9, therein is shown the structure of FIG. 8 with the integrated circuit die 106 attached thereon. The integrated circuit die 106 can be attached to the top substrate-cover 120. The internal interconnect 110 can be attached to the conductive portion 124 and the integrated circuit die 106 and electrically couple the contacting structures.

The integrated circuit die 106 and the attaching structure can vary. For example, the integrated circuit die 106 can be a flip chip attached with the internal interconnect 110, such as solder, conductive posts, or a combination thereof. Also, for example, the integrated circuit die 106 can be a wire-bond die, attached to the top substrate-cover 120 with an adhesive (not shown), and electrically coupled to the internal interconnect 110, such as a bond wire (not shown).

Figure 10:
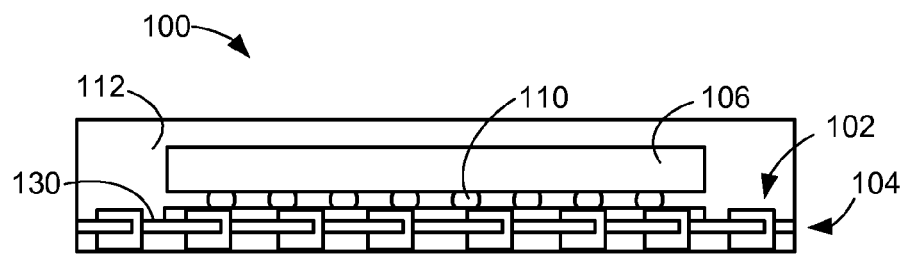
FIG. 10 is the structure of FIG. 9 with the encapsulation formed thereon.

Referring now to FIG. 10, therein is shown the structure of FIG. 9 with the encapsulation 112 formed thereon. Resin type of material can be applied over the package substrate 104 and around the integrated circuit die 106 and hardened to form the encapsulation 112. The encapsulation 112 can encapsulate the integrated circuit die 106, the internal interconnect 110, the package substrate 104 or portions thereof, or a combination thereof to form the integrated circuit packaging system 100.

The encapsulation 112 can be between the integrated circuit die 106, the internal interconnect 110, the package substrate 104, or a combination thereof. The encapsulation can be directly on the top support surface 130 of the package substrate 104 in the warpage-compensation zone 102.

Figure 11:
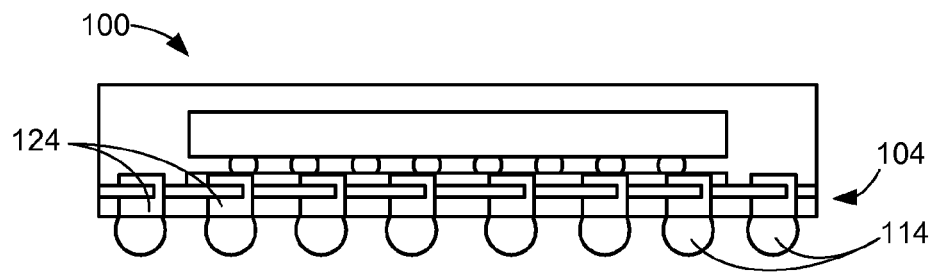
FIG. 11 is the structure of FIG. 10 with the external interconnect attached thereon.

Referring now to FIG. 11, therein is shown the structure of FIG. 10 with the external interconnect 114 attached thereon. The integrated circuit packaging system 100 can have the external interconnect 114 attached on the bottom portions thereof. Material such as solder, conductive posts, or a combination thereof can be attached to the bottom of the conductive portion 124 on a bottom portion of the package substrate 104.

Figure 12:
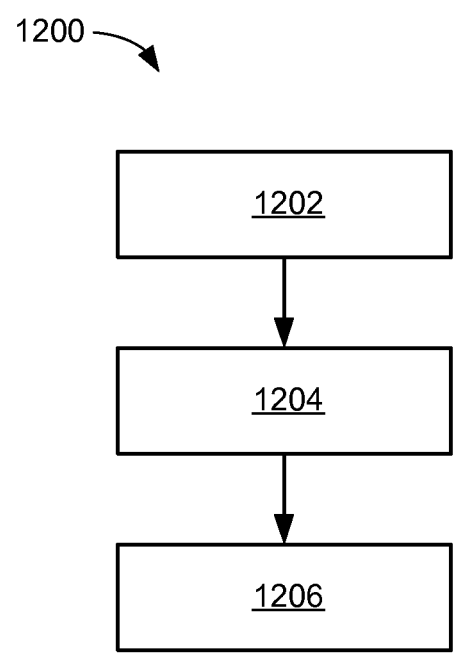
FIG. 12 is a flow chart of a method for manufacture of an integrated circuit packaging system of FIG. 1 in a further embodiment of the present invention.

Referring now to FIG. 12, therein is shown a flow chart of a method 1200 for manufacture of an integrated circuit packaging system 100 of FIG. 1 in a further embodiment of the present invention. The method 1200 includes: providing a package substrate having a warpage-compensation zone with a substrate-interior layer exposed from a top substrate-cover, and the warpage-compensation zone having contiguous exposed portion of the substrate-interior layer over corner portions of the package substrate in a block 1202; connecting an integrated circuit die to the package substrate with an internal interconnect in a block 1204; and forming an encapsulation over the integrated circuit die, with the encapsulation directly on the substrate-interior layer in the warpage-compensation zone in a block 1206.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a package substrate having only a warpage-compensation zone with a substrate-interior layer exposed from a top substrate-cover, and the warpage-compensation zone having contiguous exposed portion of the substrate-interior layer over corner portions of the package substrate;
connecting an integrated circuit die to the package substrate with an internal interconnect; and
forming an encapsulation over the integrated circuit die, with the encapsulation directly on the substrate-interior layer in the warpage-compensation zone, wherein the warpage-compensation zone is capable of preventing warpage without additional support structure or additional stress-relief structure.

2. The method as claimed in claim 1 wherein providing the package substrate having the warpage-compensation zone includes providing the warpage-compensation zone with a zone size for controlling an amount of exposure of the substrate-interior layer exposed from the top substrate-cover.

3. The method as claimed in claim 1 wherein providing the package substrate includes providing the package substrate having a conductive portion in the warpage-compensation zone only for routing electrical signals along the package substrate.

4. The method as claimed in claim 1 wherein:
the integrated circuit die includes a die-perimeter wall on an outer periphery portion of the integrated circuit die; and
the warpage-compensation zone of the package substrate includes a top substrate-side coplanar with the die-perimeter wall.

5. A method of manufacture of an integrated circuit packaging system comprising:
providing a package substrate having only a warpage-compensation zone with a substrate-interior layer exposed from a top substrate-cover and a top cover strip directly on the substrate-interior layer for controlling the exposure, with the warpage-compensation zone having the top cover strip extending straight between opposing edges of the package substrate;
connecting an integrated circuit die to the package substrate with an internal interconnect; and
forming an encapsulation over the integrated circuit die, with the encapsulation directly on the substrate-interior layer in the warpage-compensation zone, wherein the warpage-compensation zone is capable of preventing warpage without additional support structure or additional stress-relief structure.

6. The method as claimed in claim 5 wherein providing the package substrate includes providing the top cover strip having a strip-width and a separation-width between instances of the top cover strip for controlling an amount of exposure of the substrate-interior layer exposed from the top substrate-cover.

7. The method as claimed in claim 5 wherein providing the package substrate includes providing the package substrate having instances of the top substrate-cover orthogonal and integrally connected to each other.

8. The method as claimed in claim 5 wherein providing the package substrate includes providing the warpage-compensation zone having a shape of a rectangular frame surrounding the top substrate-cover.

9. The method as claimed in claim 5 wherein connecting the integrated circuit die includes attaching the integrated circuit die with an outer periphery portion of the integrated circuit die directly over and overlapping the warpage-compensation zone.

10. An integrated circuit packaging comprising:
a package substrate having a warpage-compensation zone with a substrate-interior layer exposed from a top substrate-cover, and the warpage-compensation zone having contiguous exposed portion of the substrate-interior layer over corner portions of the package substrate;
an integrated circuit die connected to the package substrate with an internal interconnect; and
an encapsulation formed over the integrated circuit die, with the encapsulation directly on the substrate-interior layer in the warpage-compensation zone, wherein the warpage-compensation zone does not include additional support structure or additional stress-relief structure.

11. The system as claimed in claim 10 wherein the warpage-compensation zone includes a zone size for controlling an amount of exposure of the substrate-interior layer exposed from the top substrate-cover.

12. The system as claimed in claim 10 wherein the package substrate includes a conductive portion only for routing electrical signals along the package substrate.

13. The system as claimed in claim 10 wherein:
the integrated circuit die includes a die-perimeter wall on an outer periphery portion of the integrated circuit die; and
the warpage-compensation zone of the package substrate includes a top substrate-side coplanar with the die-perimeter wall.

14. The system as claimed in claim 10 wherein the package substrate includes a top cover strip directly on the substrate-interior layer and in the warpage-compensation zone extending straight between opposing edges of the package substrate for controlling the exposure.

15. The system as claimed in claim 14 wherein the warpage-compensation zone of the package substrate includes the top cover strip having a strip-width and a separation-width between instances of the top cover strip for controlling an amount of exposure of the substrate-interior layer exposed from the top substrate-cover.

16. The system as claimed in claim 14 wherein the package substrate includes instances of the top substrate-cover orthogonal and integrally connected to each other.

17. The system as claimed in claim 14 wherein the top substrate-cover of the package substrate is not for providing additional support or stress-relief in the warpage-compensation zone.

18. The system as claimed in claim 14 wherein an outer periphery portion of the integrated circuit die is directly over and overlaps the warpage-compensation zone.

* * * * *